United States Patent
MacKay et al.

[11] Patent Number: 6,126,059
[45] Date of Patent: Oct. 3, 2000

[54] CAPTURED-CELL SOLDER PRINTING AND REFLOW METHODS AND APPARATUSES

[75] Inventors: John T. MacKay, San Jose; Thomas E. Molinaro, Newark; David G. Love, Pleasanton; Patricia R. Boucher, Fremont, all of Calif.

[73] Assignee: Fujitsu Limited, Japan

[21] Appl. No.: 09/379,993

[22] Filed: Aug. 24, 1999

Related U.S. Application Data

[62] Division of application No. 08/863,800, May 27, 1997, Pat. No. 5,988,487.

[51] Int. Cl.$^7$ .......................... B23Q 16/08; B23K 37/06; B23K 1/00
[52] U.S. Cl. .............................. 228/9; 228/22; 228/33; 228/39; 228/44.7
[58] Field of Search .................. 101/114; 228/8, 228/9, 33, 22, 248.1, 118, 180.22, 39, 254, 212, 44.7, 49.5; 438/613, 615; 427/96

[56] References Cited

U.S. PATENT DOCUMENTS

| | | | |
|---|---|---|---|
| 4,523,712 | 6/1985 | Zado | 228/207 |
| 4,622,239 | 11/1986 | Schoenthaler et al. | 427/96 |
| 4,763,829 | 8/1988 | Sherry | 228/124.1 |
| 4,856,185 | 8/1989 | Baumgartner et al. | 29/840 |
| 4,893,403 | 1/1990 | Heflinger et al. | 29/840 |
| 4,950,623 | 8/1990 | Dishon | 438/614 |
| 4,953,460 | 9/1990 | Wojcik | 101/129 |
| 5,001,829 | 3/1991 | Shelhorn | 29/840 |
| 5,014,162 | 5/1991 | Clark et al. | 361/784 |
| 5,137,845 | 8/1992 | Lochon et al. | 438/614 |
| 5,172,469 | 12/1992 | Onda et al. | 29/762 |
| 5,197,655 | 3/1993 | Leerssen et al. | 228/254 |
| 5,206,585 | 4/1993 | Chang et al. | 324/754 |
| 5,307,983 | 5/1994 | Dudderar et al. | 228/180.22 |
| 5,310,574 | 5/1994 | Holtmann | 427/58 |
| 5,346,118 | 9/1994 | Degani et al. | 228/180.22 |
| 5,381,848 | 1/1995 | Trabucco | 164/102 |
| 5,395,040 | 3/1995 | Holzmann | 228/254 |
| 5,438,020 | 8/1995 | Grancher et al. | 437/180.5 |
| 5,439,164 | 8/1995 | Hasegawa et al. | 228/194 |
| 5,449,108 | 9/1995 | Park | 228/103 |
| 5,460,316 | 10/1995 | Hefele | 228/39 |
| 5,492,266 | 2/1996 | Hoebener et al. | 224/248.1 |
| 5,535,936 | 7/1996 | Chong et al. | 228/175 |
| 5,539,153 | 7/1996 | Schwiebert et al. | 174/260 |
| 5,759,269 | 6/1998 | Cutting et al. | 118/213 |
| 5,782,399 | 7/1998 | Lapastora | 228/41 |
| 5,806,753 | 9/1998 | Bielick et al. | 228/248.1 |
| 5,842,626 | 12/1998 | Bhansali et al. | 228/180.22 |

*Primary Examiner*—Patrick Ryan
*Assistant Examiner*—Kiley Stoner
*Attorney, Agent, or Firm*—Coudert Brothers

[57] ABSTRACT

Disclosed are methods and apparatuses for forming solder bumps on integrated circuit chips (and other similar circuitized units) and apparatuses. A screening stencil is laid over the surface of the substrate and solder paste material is deposited into the stencil's apertures with a screening blade. The stencil is placed in such a manner that each of its apertures is positioned over a substrate pad, upon which a solder bump is to be formed. Next, a flat pressure plate is laid over the exposed top surface of the stencil, which creates a fully enclosed, or "captured", cell of solder paste within each stencil aperture. Then, with the stencil and plate remaining in place on top of the substrate, the substrate is heated to a temperature sufficient to reflow the solder paste material. After reflow, the substrate is cooled, and the pressure plate and stencil are thereafter removed, leaving solder bumps on the substrate. The use of the pressure plate ensures the proper formation of the solder bumps at high densities of solder bumps (i.e., high densities corresponding to small solder bump sizes and small pitch distances between solder bumps).

19 Claims, 5 Drawing Sheets

CAPTURED-CELL SOLDER PRINTING AND REFLOW METHODS AND APPARATUSES

This is a divisional application of U.S. application Ser. No. 08/863,800, filed May 27, 1997, entitled "Captured-Cell Solder Printing and Reflow Methods", now U.S. Pat. No. 5,988,487.

FIELD OF THE INVENTION

The present invention relates to methods of forming solder bumps on integrated circuit chips (and other similar circuitized units) and apparatuses therefore, and particularly relates to forming very small solder bumps with small pitch separation and with high aspect ratios.

BACKGROUND OF THE INVENTION

As the circuit density of integrated circuit (IC) chips and multi-chip modules (MCMS) has increased over the past 10 years, flip-chip bonding techniques have been increasingly used to meet the ever increasing interconnect densities between chip and module substrates. In flip-chip bonding, an array of solder bumps is formed on one of the components, usually the IC chip, and this component is turned over to face the second component in a confronting relationship. The two components are then heated to reflow the solder bumps, thereby making the connections between the two components.

One of the major drawbacks in the flip-chip process is the cost and difficulty in forming a dense array of solder bumps. At present, there are a variety of methods employed to form the solder bumps, none of which can form a high density array of solder bumps at a low cost and at a low capital investment of equipment. The evaporation technique, wherein solder is evaporated through a metal mask in an evacuated chamber, requires a high investment in capital equipment and has high cost associated with cleaning the processing equipment and with replacing the metal mask on a frequent basis. The evaporation technique only achieves moderate densities and moderate solder-bump sizes because of the thermal mis-match between the evaporation mask and the substrate.

To achieve higher densities and smaller bump sizes, the electroplating technique is used. In this technique, the substrate surface is covered with an electroplating seed layer, then masked with a photoresist, which is then pattern exposed and developed to form an electroplating mold over each substrate pad, with the seed layer exposed at the bottom of each mold. The seed layer is then electroplated to fill the molds, and the photoresist and the seed layer are thereafter stripped with separate chemical etchants. The electroplating technique is time consuming (due to its many steps), requires high capital expenditures since several pieces of processing equipment are required, and involves hazardous chemicals. Nonetheless, this technique provides the highest bump density and the smallest bump size.

The stenciling technique is the least expensive and requires the least amount of capital expenditure. In this technique, a stencil having apertures therein is placed over the substrate with the apertures overlying corresponding pads of the substrate. As the stencil is held in place, an amount of solder paste is dispensed onto the stencil, and a screening blade (sometimes called "doctor blade") is moved across the stencil surface in such a manner as to force paste into the stencil apertures. The stencil is then removed, which leaves behind bodies of solder paste on the pads, and the bodies are thereafter reflowed to form the solder bumps. This method requires little capital investment, and is comprised by a few quick and inexpensive steps. However, the method cannot achieve small bump sizes and high bump densities for the following reasons. When the stencil is lifted from the substrate, a portion of the solder paste within the aperture sticks to the aperture's side walls and is lifted away from solder paste body. For large apertures, the portion of removed solder paste is a relatively small fraction of the total amount initially deposited in the aperture. However, the fractional amount increases dramatically when the aperture diameter is decreased, and increases to the point where the method is no longer practical. Compounding this problem is the fact that such solder paste stencils have "hour-glass" shaped cross-sections with a constriction of the diameter in the middle aperture's length. The constriction causes a greater amount of paste to be removed.

Accordingly, under the present prior art techniques, one is forced to use expensive and capital-intensive methods to achieve moderate to high density solder bump densities. In order for the flip-chip bonding technology to be commercially successful, a less expensive and less capital-intensive way of achieving high-density solder bumps and small solder-bump size must be found.

SUMMARY OF THE INVENTION

The present invention provides fast, low-cost, and non-capital intensive methods and apparatuses for forming arrays of solder bumps at moderate to high densities.

Broadly stated, the methods according to the present invention comprise the steps of laying a screening stencil over the surface of the substrate and screen depositing solder paste material into the stencil's apertures. The stencil is placed in such a manner that each of its apertures is positioned over a substrate pad, upon which a solder bump is to be formed. Next, a flat pressure plate is laid over the exposed top surface of the stencil, which creates a fully enclosed, or "captured", cell of solder paste within each stencil aperture. Next, with the stencil and plate remaining in place on top of the substrate, the substrate is heated to a temperature sufficient to reflow the solder paste material. In this manner, the solder paste is pulled away (i.e., detached) from the stencil side walls and anchored to the substrate pad before the stencil is removed. The inventors have discovered that the use of the pressure plate is essential in ensuring that proper formation of the solder bumps at high densities. Without the pressure plate, the inventors have observed that solder flows out of the bottom of the stencil for small diameter apertures during reflow. The steps of keeping the stencil in place during reflow and of using the pressure plate are contrary to convention practice, wherein the stencil is removed before the heating step, and wherein the use of a pressure plate is unknown.

In preferred embodiments of the present invention, the heating of the substrate is controlled so as to limit the rate of increase in temperature. This control of temperature enables a slow and orderly evolution of solvent and flux gases from the captured cells to occur.

Broadly stated, apparatuses according to the present invention comprise a heater stage up which the substrate is placed, one or more heater elements within the heater stage, a screening blade for screen depositing solder paste into a stencil, and a pressure plate positioned in an opposite confronting relationship to the surface of the heater stage. In preferred embodiments, a temperature sensor is attached to either the heater stage or the substrate, and a controller monitors the sensor temperature and controls the power to the heating elements of the heater stage so as to limit the rate of change of the substrate's temperature.

As an unexpected result, the inventors have achieved smaller diameter solder bumps having higher aspect ratios (height:width) than those achieved by the prior art screening technique. In the prior art screening technique, as mentioned above, the stencil removes solder paste from the deposited solder body when the stencil is lifted away from the substrate, and the amount of solder paste so removed increases as the diameter of solder bump decreases. To reduce the amount of removed solder in the prior art technique, the thickness of the stencil is reduced to reduce the contact surface area between the solder-paste body and the stencil. However, the reduction in stencil thickness necessarily reduces the aspect ratio of the stencil aperture, thereby reducing the aspect ratio of the resulting solder bump. With the prior art technique, it is very difficult to achieve solder-bump aspect ratios of greater than 1:4 (height:width). In contrast, the present invention does not have this limitation because the solder paste is detached from the stencil walls before the stencil is removed. The present invention can achieve aspect ratios of well above 1:4, and can readily achieve an aspect ratio close to 1:1.

Accordingly, it is an object of the present invention to provide methods and apparatuses for forming solder bumps which are inexpensive and not capital intensive, and which can achieve high density arrays of solder bumps.

It is another object of the present invention to enable the formation of small solder bumps with height-to-width aspect ratios that are much higher than achievable with prior art screening techniques.

This and other objects of the present invention will become apparent to those skilled in the art from the following detailed description of the invention, the accompanying drawings, and the appended claims.

DETAILED DESCRIPTION OF THE INVENTION

Figure 1:
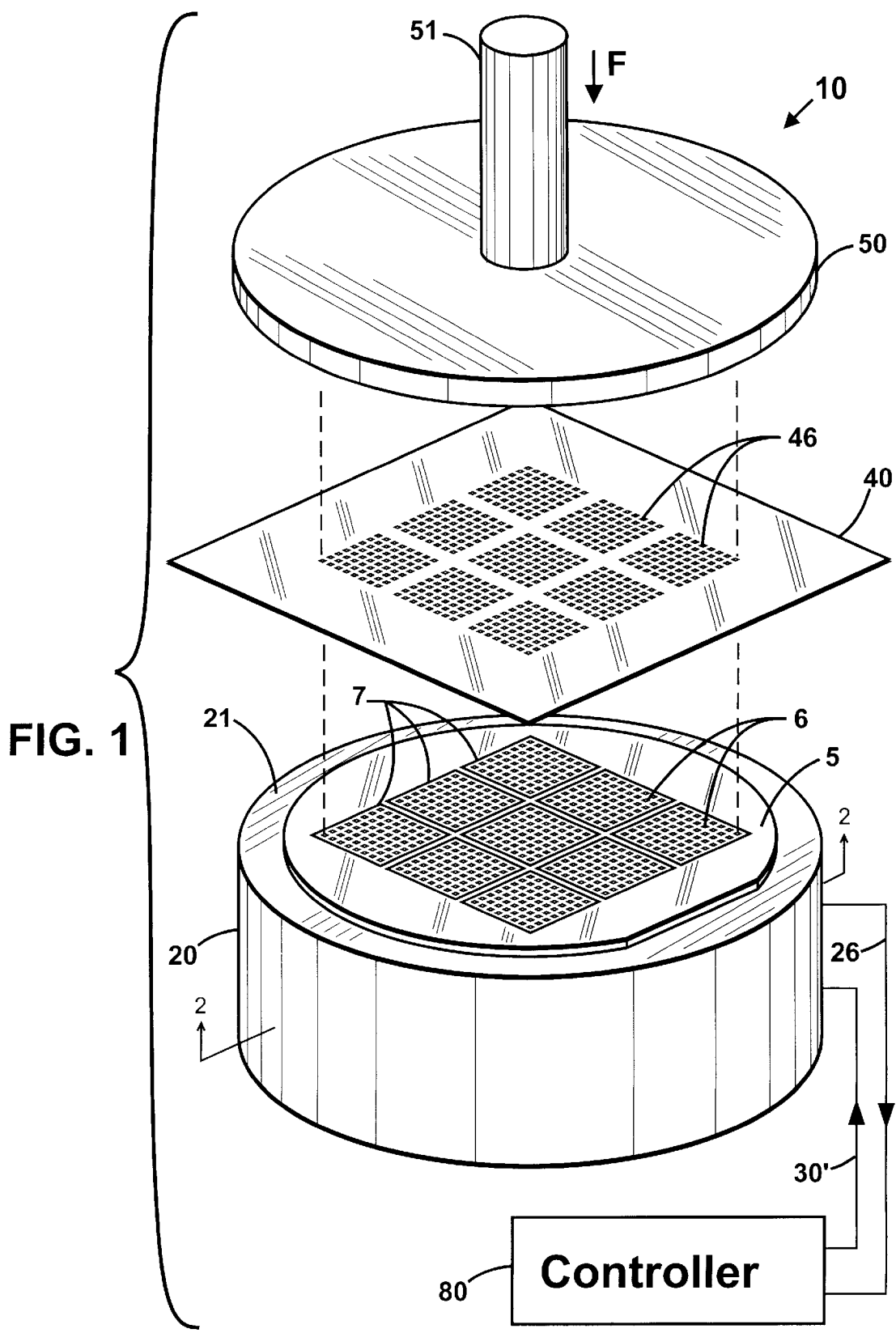
FIG. 1 shows a perspective view of an exemplary apparatus according to the present invention.

An exemplary captured-cell solder printing apparatus according to the present invention is shown at 10 in FIG. 1. Printing apparatus 10 comprises a base heater stage 20 having a flat top surface 21 upon which a substrate (e.g., wafer) 5 is placed. Substrate 5 comprises a plurality of circuitized units 7, with nine such units 7 being shown in FIG. 1. Each of circuitized units 7 comprises an array of pads 6. Solder bumps are to be formed on pads 6 by the apparatus and methods according to the present invention. Units 7 may comprise a MCM substrate, or may comprise an integrated circuit chip prior to being separated from wafer substrate 5.

Printing apparatus 10 further comprises a stencil mask 40, which comprises a plurality of apertures which correspond to the pads 6 of substrate 5. The relative locations of apertures 46 within mask 40 correspond to the relative locations of pads 6 on substrate 5. As described below in greater detail with respect to FIG. 2, stencil 40 is positioned directly on top of substrate 5, with apertures 46 and pads 6 in corresponding relationship to one another, and soldering paste material is screened into apertures 46 using a screening blade, or doctor blade. Corresponding alignment marks may be placed on both the substrate 5 and stencil 40 to facilitate the alignment of apertures 46 to pads 6. The solder paste will then later be reflowed when heater stage 20 applies heat to substrate 5. Stencil 40 comprises a material, at least on its exposed surface, which does not substantially adhere to molten solder. Exemplary materials are stainless steel, molybdenum, and chrome plated materials.

Apparatus 10 further comprises a pressure plate 50 positioned above stencil 40. As described in greater detail with respect to FIG. 3, pressure plate 50 is used to apply pressure against stencil 40 during reflow of the solder paste material. The pressing surface of plate 50 comprises a material to which solder does not easily adhere or wet to. Exemplary materials are glass, stainless steel, nickel oxide, and chromium oxide. In one constructed embodiment according to the present invention, plate 50 comprises a glass plate.

Figure 2:
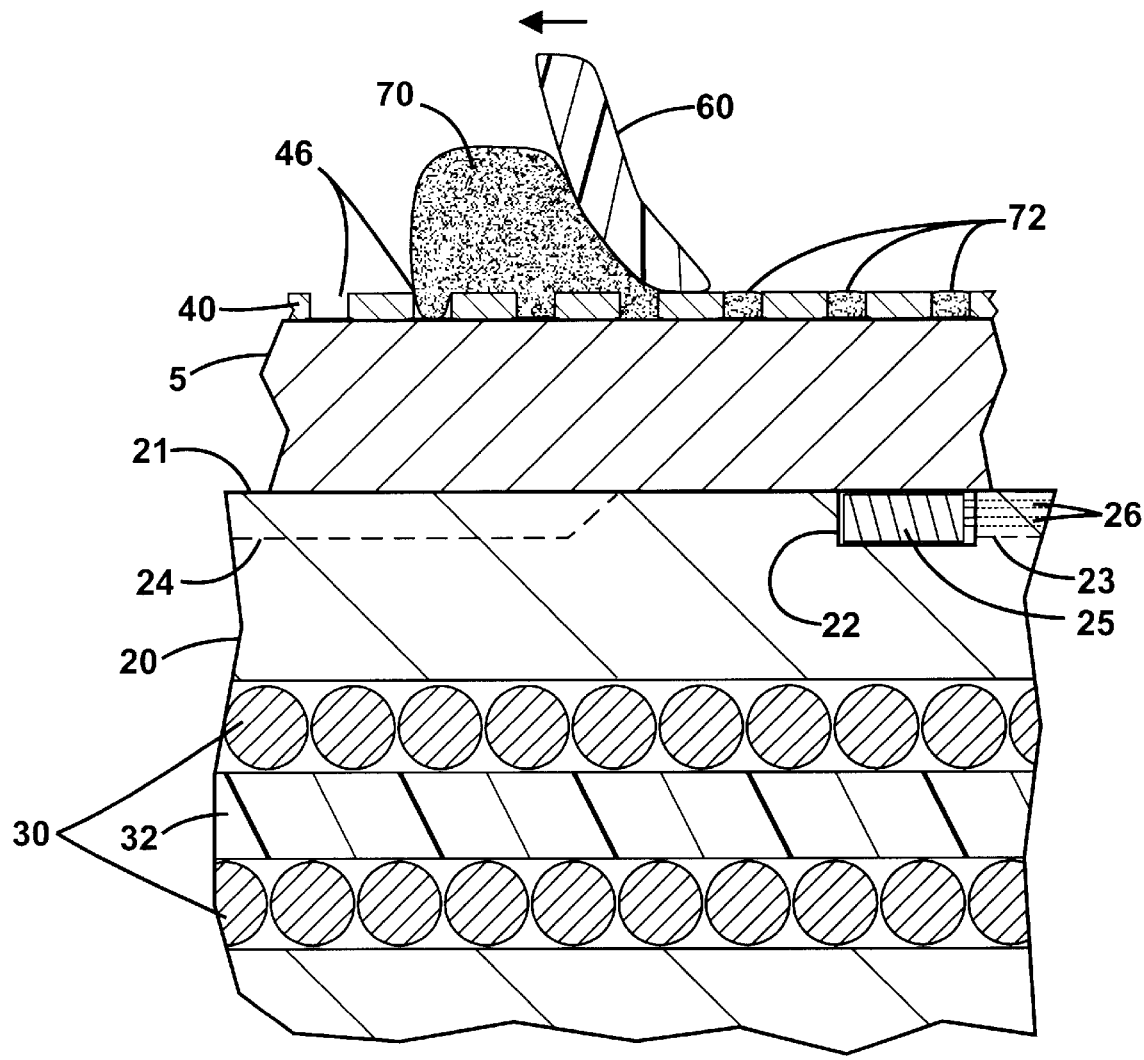
FIG. 2 shows a cross-sectional view of an exemplary apparatus according to the present invention during the step of screening solder paste into the apertures of the stencil.

FIG. 2 shows a cross-sectional view of heater stage 20 with substrate 5 placed on top surface 21. Stage 20 comprises one or more vacuum grooves 24 formed at the face of top surface 21, the vacuum grooves 24 being tied to a common vacuum source, which may be brought to the top surface 21 by way of an aperture through heater stage 20. A vacuum is applied through groove 24 to hold substrate 5 in place and against top surface 21. Heater stage 20 also comprises a plurality of heater windings 30 within the base of stage 20. Each heater winding 30 comprises a resistive wire wound about an insulating tube, or form, 32. The heater windings 30 raise the temperature of stage 20 in order to reflow the solder that is to be disposed on the top surface of substrate 5. Heater stage 20 further comprises a temperature sensor 25 which is disposed within a recess 22 at the top surface 21 of stage 20. The sensor 25 comprises electrical signal wires 26 which are carried away from top surface 21 through a recess 23. Both recess 23 and electrical lines 26 are shown by dashed lines, as they are offset from the cross-sectional plane of FIG. 2. The output of sensor 25 is provided to a controller 80, which is shown in FIG. 1, via lines 26. Controller 80 provides power to heater windings 30 through electrical lines 30' (shown in FIG. 1).

As shown in FIG. 2, stencil 40 is laid over the top surface of substrate 5, with each stencil aperture 46 lying over a corresponding pad 6 of the substrate. An amount of solder paste 70 is disposed along one side of stencil 40, and then a screening blade 60 is run across the surface of stencil 40 in such a manner that spreads solder paste material 70 into the stencil apertures 46. A plurality of solder-filled cells 72 is thereby formed in the stencil apertures 46. The solder paste 70 typically comprises ground particles of solder mixed with a fluidizing solvent and a flux. A wax may be added to the paste to improve the screening of the paste into the apertures. During the screen depositing step, stencil 40 may be held in place by any of the number of stencil-holding techniques known to the art. For example, stencil 40 may be held within a larger frame that is typically used to screen printed circuit boards and the like. Screening blade 60 is preferably formed of a resilient material, which allows its tip to conform to the non-planarities that may be inherent in substrate 5.

Figure 3:
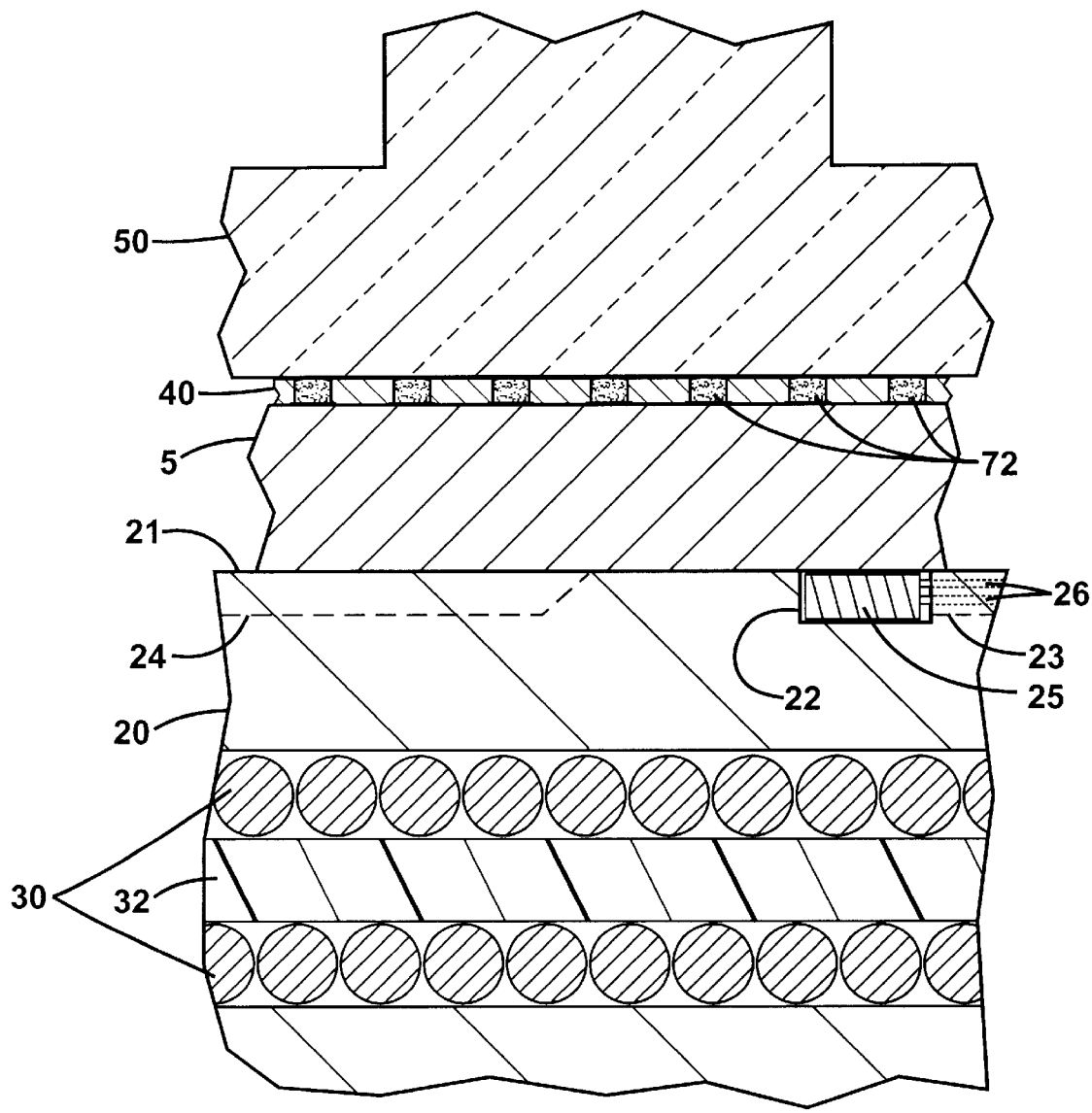
FIG. 3 shows a cross-sectional view of an exemplary apparatus according to the present invention during the step of reflowing the solder paste with the stencil and pressure plate in place.

Next, referring to FIG. 3, pressure plate 50 is brought against the top surface of stencil 40, with plate 50 preferably covering all of the filled apertures 46. Plate 50 preferably applies pressure of at least two pounds-per-square-inch (2 PSI) upon stencil 40, and preferably between two pounds-per-square-inch (2 PSI) and seven pounds-per-square-inch (7 PSI). Heater windings 30 of stage 20 are then powered by controller 80 (shown in FIG. 1) to heat stage 20 to a point just above the reflow temperature of the solder paste, which is typically 20–30 degrees Celsius (° C.) above the melting point of the solder particles. During this time, plate 50 and stencil 40 confine the solder paste within an enclosed cell 72, the so-called "captured-cell". Power to the heater windings 30 is controlled such that the temperature of substrate 5 does not rise faster than approximately 100° C. over one minute, and more preferably not more than 70° C. over one minute. This relatively slow rate of temperature increase, which is unconventional in the art, ensures that the solvent and flux of the solder paste within the cells 72 out gas (i.e., evolve away) from the cell through the interface between plate 50 and stencil 40 in a slow and controlled manner. A fast rate of temperature rise, for example, on the order of 200° C. or more over one minute, can cause the evolving solvent and flux to generate gas pressure within the cell, which may in turn force solder particles to flow out of the bottom of the captured-cell.

Once the temperature of substrate 5 reaches a point which is about 20 to 30° C. above the reflow temperature of the solder, the temperature is held at that point, with plate 50 and stencil 40 in place, for approximately 15 to 30 seconds. Thereafter, the power to the heating windings is reduced such that the substrate temperature begins to fall. In one embodiment of the present invention, the substrate is cooled to approximately 60° C. before the plate 50 and the stencil are removed. In another embodiment of the present invention, the substrate is cooled to a point which is between 80 and 95 percent of the melting point of the reflow solder (as measured in degrees Kelvin), at which time both the pressure plate and the stencil are lifted away from the substrate. For an exemplary solder comprising 63% tin (Sn) and 37% lead (Pb), the melting point is 456° K (Kelvin), which is 183° C. (Celsius, which is the same as Centigrade), the 95% point is 433° K (160° C.), and the 80% point is 365° K (92° C.).

Figure 5:
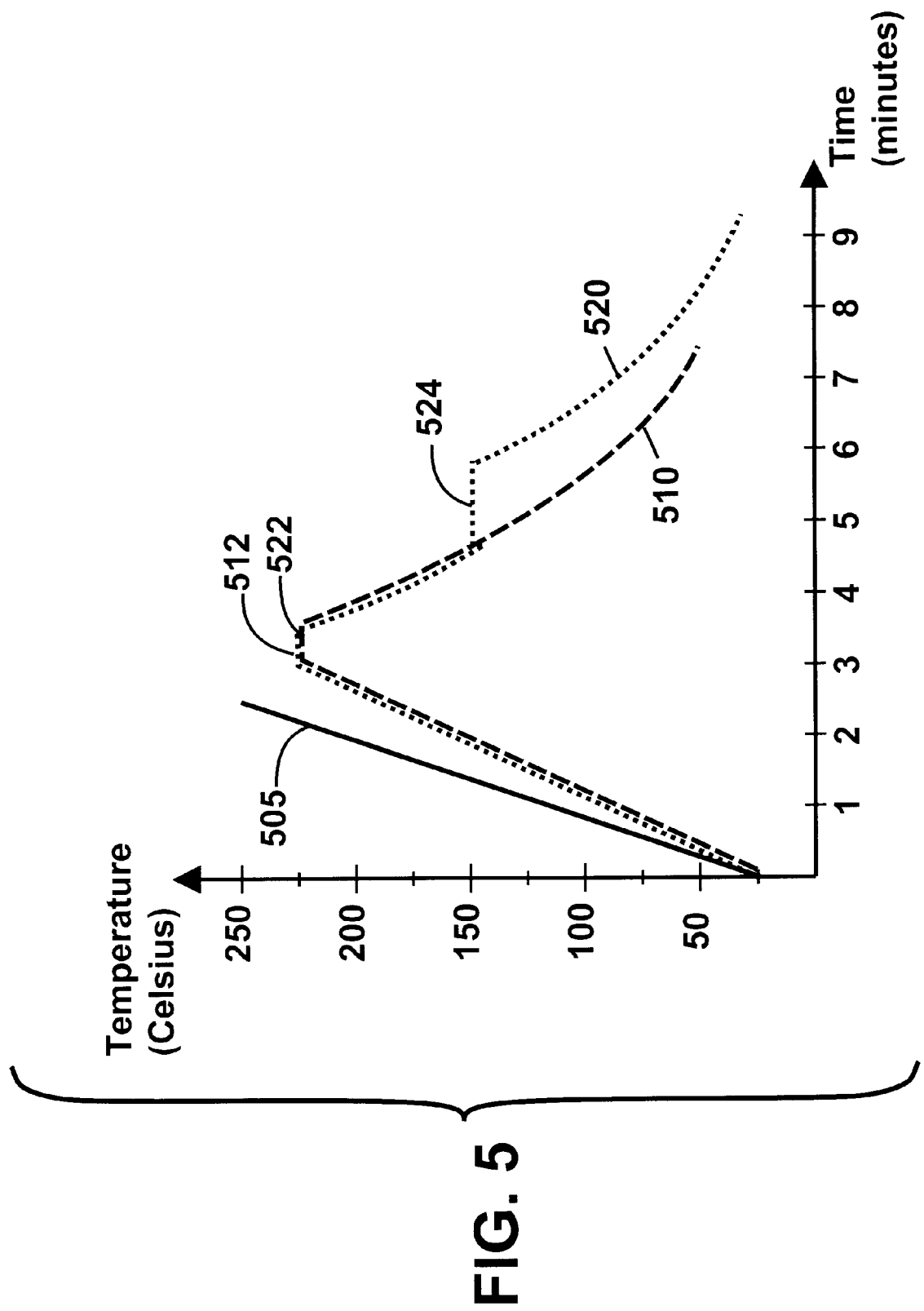
FIG. 5 is a timing diagram of exemplary temperature control curves.

FIG. 5 shows a timing diagram for the two exemplary substrate heating programs described above. The programs are designated as 510 and 520, and are diagramed in terms of temperature (in Celsius) as a function of time (in minutes). In these examples, the melting point of the solder is 183° C., and the solder is to be reflowed at between 215° C. and 220° C. Each of the programs starts at time zero with a temperature ramp rate of 67° C. per minute over three minutes, for a total rise of 200° C. in three minutes. (Program 520 has been offset slightly in time so as to better distinguish the two programs in time.) A preferred maximum limiting rate of 100° C. per minute is shown at 505. At the three minute mark, the temperature in each of the programs is stabilized for a time period 512 of approximately 30 seconds for reflow. This time period is denoted as 522 for program 520. Then, for program 510, power to the heater elements is turned off, and the heater stage and substrate are cooled to less than 60° C., at which point stencil 40 and pressure plate 50 are removed. In program 520, a partial cooling to approximately 150° C. occurs, and stabilized at that temperature for a time period 524, which is on the order of 1 to 1.5 minutes. The reflow solder completes its solidification during the beginning portion of period 524. At the end of period 524, pressure plate 50 and stencil 40 are removed. Thereafter, the substrate is cooled to handling temperature (e.g., less than 60° C.). In program 520, there is only an excursion of about 70° C. between periods 522 and 524, which ensures that there is little stress between the solidified solder bumps and the stencil. Controller 80 (shown in FIG. 1) can readily implement either of programs 510 and 520 using the temperature sensed by sensor 25. In some cases, there may be a temperature difference between the location of sensor 25 and the top of the substrate surface, but such a temperature difference can be measured by known techniques and an appropriate offset temperature can be provided to controller 80.

Normally, the material of stencil 40 is chosen such that its coefficient of thermal expansion (CTE) is substantially close to that of substrate 5, usually within 100% of that of the substrate. This ensures that there will be little mechanical stress created between the stencil and the solder bumps upon cooling after the reflow operation. The partial cooling embodiment described above enables the coefficients of thermal expansion (CTEs) to be substantially different, since the stencil is removed before cooling is completed, and before the system has undergone a large temperature change. This enables the benefit of being able to choose from a wider variety of materials for stencil 40. By the same token, where the stencil material has a similar CTE as the substrate, the partial cooling embodiment generates much less stress between the stencil and the solder bumps upon removing the stencil, which is very important when small feature-size solder bumps are being formed.

The inventors have discovered that pressure plate 50 is essential in achieving small-sized solder bumps. Without plate 50, it has been observed that solder paste flows out through the bottom of the aperture 40 upon reflow. This effect does not appear to occur for larger-sized apertures and solder bumps. This benefit provided by pressure plate 50 is unexpected, since, upon first inspection, one of ordinary skill in the art would believe that the confinement provided by plate 50 would force a solder paste to flow out of the bottom of the aperture upon reflow, due to pressure buildup by the evolving solvent and flux gases. However, the inventors have found this not to occur with proper control of the applied heat and temperature to substrate 5.

Pressure may be applied to pressure plate in a number of ways known to the art. As one example, weights may be placed onto the top surface of plate 50. Each such weight may have the shape of a round disk (or plate) with an aperture formed in the center so as to fit around the shaft 51 of pressure plate 50. The pressure-per-square-inch applied by the weights can be computed by the weight of the weights in a straight forward manner well-known to the art (i.e., total weight divided by the surface area of substrate 5). As another example, a gas-filled piston assembly, such as that often used in chemical-mechanical polishing machines to press the sample against the polishing platen, may be coupled to the shaft 51 of pressure plate 50 to apply the desired amount of pressure. The pressure-per-square-inch applied by the piston assembly can be computed by the fluid pressure within the piston and the piston's head area, as is known in the art (i.e., fluid pressure times piston head area divided by substrate surface area).

Figure 4:
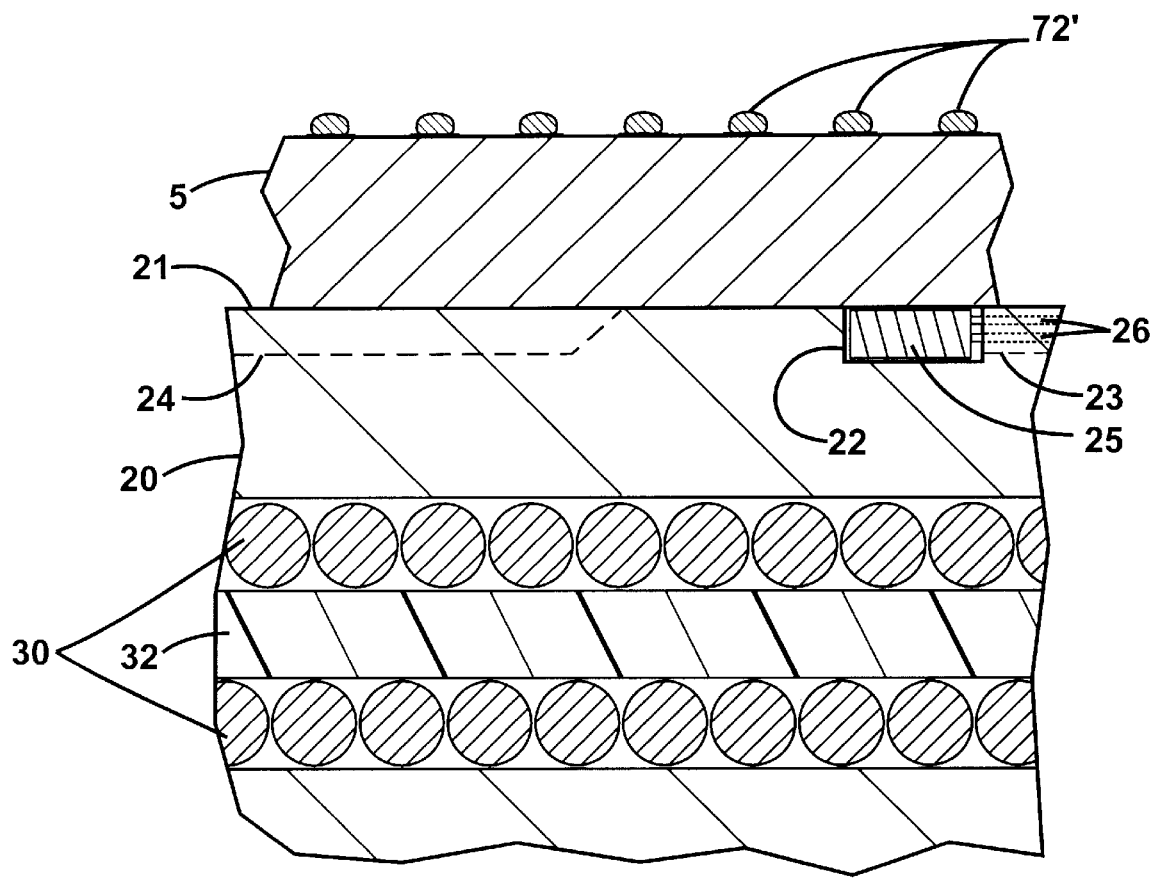
FIG. 4 shows a cross-sectional view of an exemplary apparatus according to the present invention after the reflow step.

FIG. 4 shows the resulting solder bump structures 72 after plate 50 and stencil 40 have been removed. With the present invention, solder bumps as small as 130 microns (0.13 mm) in diameter on a pitch of 200 microns (0.20 mm) can be manufactured. This compares very favorably to the prior art evaporation technique, where the smallest solder bump is 150 microns (0.15 mm) on a pitch of 300 microns (0.30 mm).

Stencils with substantially vertical side walls are currently available from several stencil manufacturers. These stencils can have diameters as small as 12.5 microns plus 1.5 times the thickness of the stencil. Stencils as thin as 100 microns are available, which enable a diameter as small as 162.5 microns. Since the solder paste within the stencil aperture shrinks upon reflow, a solder bump of around 130 microns can be formed with the 162.5 micron diameter aperture. With stencil thickness of 80 microns and less, apertures of 150 microns and less are possible.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A solder printing and reflow apparatus comprising:
   a heater stage having a surface upon which a substrate may be placed;
   one or more heating elements disposed within the heater stage;
   a screening blade positioned above the heater stage and capable of spreading solder paste over a stencil placed on top of the substrate; and
   a pressure plate having a pressing surface disposed opposite to the surface of said heater stage and in a confronting relationship thereto, said pressure plate being movable between a closed position against the heater stage surface and an open position away from said heater stage surface.

2. The apparatus of claim 1 further comprising:
   a temperature sensor attached to one of the heater stage and the pressure plate; and
   a controller coupled to the one or more heater elements and to the temperature sensor, said controller regulating a source of power applied to the one or more heater elements.

3. The apparatus of claim 2 wherein said heater stage further has a recess in it surface, and wherein said temperature sensor is disposed in said recess.

4. The apparatus of claim 1 further comprising a temperature sensor attached to one of the heater stage and the pressure plate to measure a temperature; and
   a controller responsive to said temperature sensor for controlling said one or more heating elements, wherein the temperature measured by said temperature sensor is not increased by more than a rate of 100° C. per minute.

5. The apparatus of claim 1 further comprising a temperature sensor attached to one of the heater stage and the pressure plate to measure a temperature, and a controller responsive to said temperature sensor for controlling said one or more heating elements, wherein said controller raises the temperature at said sensor from a first value to a second value and thereafter lowers the temperature to a third value which is between the first and second values, wherein said pressure plate is set in its closed position when the temperature rises to the second value and thereafter falls to the third value, and wherein said pressure plate is set in its open position at a point in time when the temperature is at the third value.

6. The apparatus of claim 5 wherein the temperature at said sensor is maintained at said third value for a period of time before said pressure plate is set in its open position.

7. The apparatus of claim 1 wherein said pressure plate comprises a material to which solder does not adhere.

8. The apparatus of claim 1 wherein said pressure plate comprises at least one of glass, stainless steel, nickel oxide, and chromium oxide.

9. The apparatus of claim 1 further comprising a stencil positioned above the surface of said heater stage.

10. The apparatus of claim 9 wherein said pressure plate applies a pressure of at least 2 PSI against stencil.

11. The apparatus of claim 10 wherein the pressure applied by said pressure plate is not more than 7 PSI.

12. The apparatus of claim 1 wherein said screening blade comprises a resilient material.

13. A solder printing and reflow apparatus comprising:
   a heater stage having a first surface;
   one or more heating elements disposed within the heater stage;
   a pressure plate having a second surface disposed opposite to the first surface of said heater stage and in a confronting relationship thereto, said pressure plate and heater stage having a closed position in which the first and second surfaces are at a first distance with respect to one another, and an open position in which the first and second surfaces are at a second distance with respect to one another, the second distance being greater than said first distance, one of said first and second surfaces for receiving a substrate; and
   a screening blade which is movable into a position between the first and second surfaces and is capable of spreading solder paste over a stencil which is placed on top of the substrate.

14. The apparatus of claim 13 further comprising:
   a temperature sensor attached to one of the heater stage and the pressure plate; and
   a controller coupled to the one or more heater elements and to the temperature sensor, said controller regulating a source of power applied to the one or more heater elements.

15. The apparatus of claim 14 wherein said heater stage further has a recess in said first surface, and wherein said temperature sensor is disposed in said recess.

16. The apparatus of claim 13 further comprising a temperature sensor attached to one of the heater stage and the pressure plate to measure a temperature, and
   a controller responsive to said temperature sensor for controlling said one or more heating elements, where the temperature measured by said temperature sensor is not increased by more than 100° C. per minute.

17. The apparatus of claim 13 wherein said screening blade comprises a resilient material.

18. The apparatus of claim 13 further comprising a temperature sensor attached to one of the heater stage and the pressure plate to measure a temperature, and a controller responsive to said temperature sensor for controlling said one or more heating elements, wherein said controller raises the temperature at said sensor from a first value to a second value and thereafter lowers the temperature to a third value which is between the first and second values, wherein said pressure plate and heater stage are in their closed position when the temperature rises to the second value and thereafter falls to the third value, and wherein said pressure plate and heater stage are in their open position at a point in time when the temperature is at the third value.

19. The apparatus of claim 18 wherein the temperature at said sensor is maintained at said third value for a period of time before said pressure plate and heater stage are set in their open position.

* * * * *

UNITED STATES PATENT AND TRADEMARK OFFICE
CERTIFICATE OF CORRECTION

PATENT NO. : 6,126,059
DATED : Ocotober 3, 2000
INVENTOR(S) : MacKay, et al.

It is certified that error appears in the above-identified patent and that said Letters Patent is hereby corrected as shown below:

On the Title Page,

At [73] Assignee: after "Fujitsu Limited, Japan" add --Semi-Pac, Sunnyvale, CA--.

Signed and Sealed this

Eighth Day of May, 2001

Attest:

NICHOLAS P. GODICI

Attesting Officer     Acting Director of the United States Patent and Trademark Office